United States Patent [19]

Albright et al.

[11] Patent Number: 4,735,909

[45] Date of Patent: Apr. 5, 1988

[54] METHOD FOR FORMING A POLYCRYSTALLINE MONOLAYER

[75] Inventors: Scot P. Albright, El Paso; David K. Brown, Canutillo; John F. Jordon, El Paso, all of Tex.

[73] Assignee: Photon Energy, Inc., El Paso, Tex.

[21] Appl. No.: 918,115

[22] Filed: Oct. 14, 1986

[51] Int. Cl.$^4$ ............................................. H01L 31/18
[52] U.S. Cl. ...................................... 437/4; 437/967;
437/247; 437/249; 136/258 PC; 136/260;
136/258; 427/74; 427/87; 427/190; 427/194;
427/359
[58] Field of Search .................................. 29/581, 572;
136/258 PC, 260; 148/1.5; 427/74, 86–87, 180,
190, 194, 359, 366

[56] References Cited

U.S. PATENT DOCUMENTS 4,362,896 12/1982 Singh ..................... 136/258 PC
4,609,567 9/1986 Toth et al. ........................ 427/74

Primary Examiner—Aaron Weisstuch
Attorney, Agent, or Firm—Norvell & Associates

[57] ABSTRACT

Improved techniques are provided for forming a very thin polycrystalline layer of a semiconductor material on a glass substrate. The film material may be formed from a slurry of a semiconductor powder and a liquid carrier, and the slurry economically applied at room temperature by spraying techniques. Once dried, the film is compressed by the application of a substantial mechanical force. The compressed film is regrown in a heated atmosphere, forming a polycrystalline film comprised of large mean diameter crystals, with many crystals having a mean diameter in excess of the film thickness. A high quality cadmium sulfide polycrystalline film suitable for forming a photovoltaic cells may be inexpensively manufactured according to these techniques.

20 Claims, 2 Drawing Sheets

METHOD FOR FORMING A POLYCRYSTALLINE MONOLAYER

FIELD OF THE INVENTION

The present invention relates to the formation of thin film semiconductor layers and, more particularly, the formation of a thin film polycrystalline CdS layer having large diameter crystals and suitable for manufacturing photovoltaic cells.

BACKGROUND OF THE INVENTION

Solar energy has long been recognized as an alternative to traditional hydrocarbon energy sources, and the direct conversion of solar radiation to electricity via the photovoltaic process is a growing field for research and development. Currently marketed photovoltaic devices have, however, achieved only limited acceptance in specialized industries, such as expensive telecommunications installations, lighted buoys having low electrical consumption, and outer space applications.

In view of the significant costs of manufacturing single crystal photovoltaic cells, significant efforts have been ongoing for the past 20 years to develop a low cost polycrystalline photovoltaic cell. Tremendous financial investments have been and are continuing in the commercialization of polycrystalline and amorphous silicon solar cells, and also polycrystalline cadmium sulfide solar cells. Unfortunately, such cells inherently have a lower efficiency than single crystal cells, and the high capital investment and significant manufacturing costs for producing such cells according to current manufacturing technology have substantially inhibited market acceptance.

One promising approach to mass production of polycrystalline solar energy devices at a low cost utilizes a transparent vitreous substrate, such as common float glass, with photovoltaic films formed in successive layers on the substrate. In one "back wall" arrangement disclosed in U.S. Pat. No. 4,362,896, thin film layers of tin oxide, cadmium sulfide, cuprous sulfide, and an electrode material are applied to form the cell, with radiant energy passing through the glass and tin oxide layers before being absorbed in the $CdS/Cu_2S$ heterojunction. In another similar polycrystalline photovoltaic cell, cadmium telluride is utilized in place of cuprous sulfide.

In order to achieve low cost manufacturing of such cells, the cadmium sulfide layer must be relatively thin, i.e., less than 10 microns. Also, it has been found that the formation of the cadmium sulfide layer by spray pyrolysis techniques, such as are disclosed in U.S. Pat. No. 4,338,078, are difficult to control. The varying temperatures of the glass substrate surface results in poor yield rates, which in turn significantly increases manufacturing costs.

SUMMARY OF THE INVENTION

Methods and apparatus are provided for forming improved polycrystalline semiconductor film on a rigid substrate. According to a preferred embodiment of the invention, a thin monolayer CdS film is formed on a glass substrate. The subsequent application of additional film layers produces an inexpensive photovoltaic cell of the back wall configuration.

The CdS film is formed by mixing a fine powder of cadmium sulfide and a liquid carrier, such a propylene glycol, to form a slurry of a desired texture. An exemplary slurry comprises approximately 60 grams of cadmium sulfide, 2 grams of cadmium chloride (which acts as a flux in the regrowth), and 100 grams of propylene glycol. The slurry is then sprayed or otherwise deposited on a glass substrate at room temperature. The film is dried, preferably in air at a temperature near the boiling point of the carrier. The film is then compressed by the application of significant mechanical force in the range of from 5,000 to 10,000 p.s.i. The application of compressive force preferably reduces the film thickness from approximately 50% to approximately 70% of its precompressed thickness. The compressed film is then regrown in a heated mixture of inert gas and oxygen, using the chloride as a flux to assist in crystal growth. This method produces crystals having a much larger diameter than those produced according to the spray pyrolysis techniques of U.S. Pat. No. 4,338,078.

According to one technique, the dried film is compressed by moving the glass substrate horizontally with respect to a plurality of vertically movable rollers, each actuated by a hydraulic fluid-powered cylinder. The glass travels under the rollers, resulting in compressed strips of CdS film. The cylinders are raised, the glass indexed to the next position, the cylinders lowered, and the glass again passed under the cylinders, resulting in overlapping strips of compressed film. The process is continued until substantially the entirety of the CdS film has been compressed.

The CdS film according to the present invention generally has a thickness less than 10 microns, and preferably in the range of from 4 to 8 microns. Many of the individual regrown crystals have a pancake-shaped configuration, with the top and bottom surfaces being defined by the upper and lower surfaces of the CdS film. A CdS film monolayer of single crystals between the upper and lower surfaces of the film is thus formed, with most crystals having a length and width substantially greater than their height. A relatively small gap is obtained between adjacent crystals, so that the subsequent application of another film layer for forming a a photovoltaic cell generally does not result in an unacceptable degree of short circuits through the CdS film.

The manufacturing costs of producing the CdS layer is substantially reduced since neither expensive deposition equipment nor difficult quality control parameters, such as uniformly heating glass to an exact temperature, are utilized. The efficiency of the photovoltaic cell is substantially improved, since large crystals, many having a mean diameter in excess of the film thickness, are obtained. According to one technique, the film of the present invention is utilized to form a high quality, low cost CdS/CdTe photovoltaic cell.

DETAILED DESCRIPTION OF THE PREFERRED EMBODIMENT

Figure 1:
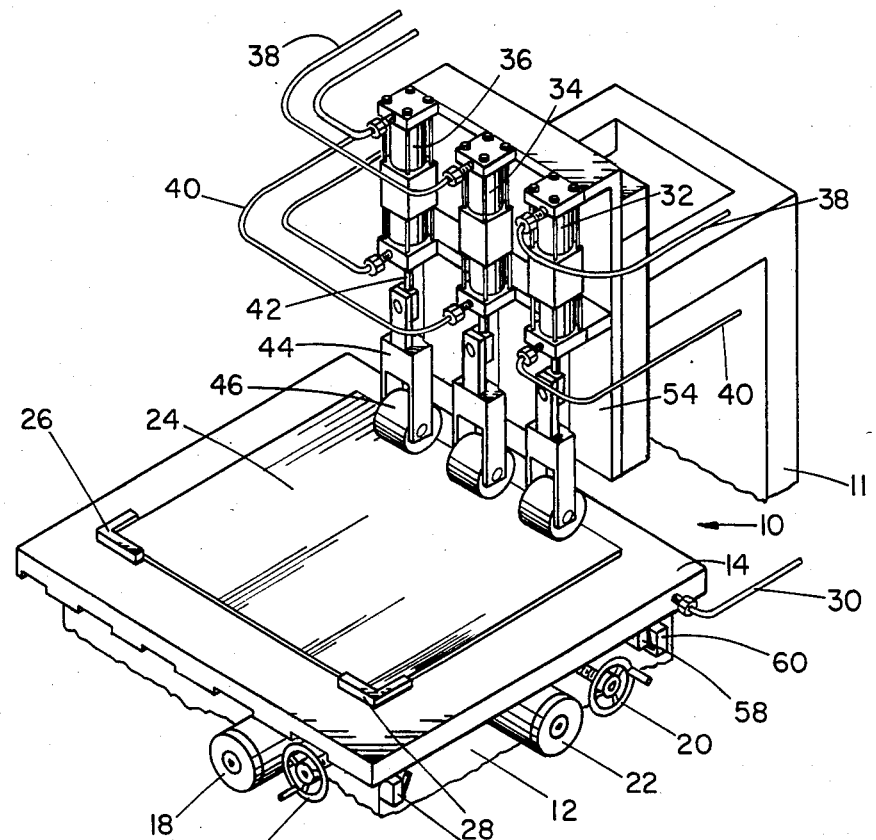
FIG. 1 is a pictorial view of apparatus suitable for compressing the CdS film according to the present invention.

The cadmium sulfide film layer formed according to the present invention may be applied to any suitable rigid substrate material. According to a preferred teaching of the invention, the layer is utilized in forming a photovoltaic cell of the back wall configuration, and accordingly the CdS layer is formed over a transparent vitreous substrate coated with a thin-layer transparent conductive material, such as tin oxide.

Since reduced product cost is a significant feature of the present invention, the vitreous substrate preferably is common window glass formed by the process wherein a glass ribbon floats on a hot tin bath. A conductive tin oxide film with a high transmissivity is applied to a surface of the float glass. The tin oxide film may be formed either when the glass is floated on the tin bath, as disclosed in U.S. Pat. No. 3,959,565, or may be sprayed on radiantly heated glass panels according to the teachings of U.S. Pat. No. 4,224,355, each hereby incorporated by reference.

The desired tin oxide film has a sheet resistance of less than 10 ohms per square, absorbs less than 10% of the incident visible light spectrum which produces solar energy by the photovoltaic process, and has an emissivity of less than 0.1 for infrared radiation having wavelengths greater than 5 microns (up to a temperature of 350° C.). Moreover, minute pin holes in such a tin oxide film, although a serious drawback to the formation of conductive tin patterns on a glass panel, are not a significant drawback to the efficiency of polycrystalline photovoltaic cells. In addition to low cost, such a conductive tin oxide film is also tightly adherent to the glass substrate, sufficiently hard to withstand the partial removal of overlying layers, chemically inert at elevated temperatures and exposure to ultraviolet irradiation, and free of impurities which might affect CdS layer formation.

The glass is preferably washed with deionized water both before the tin oxide spraying process and prior to the application of the CdS layer. As those skilled in the art recognize, reasonable care must be taken to avoid contamination of the film layers which form the photovoltaic cell in order to maintain high cell efficiency and good production yields.

A CdS slurry is prepared utilizing commercially available cadmium sulfide powder having a powder size of 2 microns or less. A small amount of cadmium chloride is added to provide the desired flux to enhance crystal growth during the regrowth stage. A suitable carrier, such as propylene glycol terpineol, is used to achieve the desired slurry texture. The desired texture will, in part, depend on the application technique and the application equipment. For an ambient air spraying operation, a mixture of approximately 60 grams of cadmium sulfide, 2 grams of cadmium chloride, and 100 grams of propylene glycol has been found acceptable. As those skilled in the art recognize, a small amount of chloride facilitates crystal growth, although a chloride level in excess of that required to react with the cadmium sulfide is deleterious to photovoltaic performance and life. Accordingly, steps should be taken to avoid excessive or residual cadmium chloride. Finally, if cadmium telluride is to be the layer overlying the cadmium sulfide film to form the photovoltaic cell, a small amount (100 to 1000 PPM) of cupric acetate may be added to the slurry to serve as a dopant.

Assuming spraying techniques are utilized to apply the CdS slurry to the glass substrate previously coated with a tin oxide film, the combination of the carrier material and ambient temperature for both the sprayed slurry and the glass substrate during application substantially decreases application costs and increases the uniformity of an acceptable uniform layer. Various types of conventional spraying techniques and equipment may be utilized to form a uniform layer. The spray process is well adapted to conveyer belt systems, with the spraying accomplished by traversing the spray guns across the width of glass panels laid on the belt, as disclosed in U.S. Pat. No. 4,224,355. It has been found that the application of a CdS slurry having a thickness of approximately 20 microns results in a large crystal CdS film of regrown crystals having a thickness of approximately 4 to 7 microns, as described subsequently.

The CdS slurry may be dried either at less than 60° C. at reduced pressure or at approximately 200° C. in air. Propylene glycol will evaporate from the layer and, if desired, may be recovered by conventional distillation techniques. The resulting product will be a polycrystalline CdS layer, although substantial voids will exist where the carrier material has evaporated. Moreover, the "as sprayed" CdS crystals will be extremely small in size, and the resultant film is not practical for producing a reasonably efficient photovoltaic cell.

According to the present invention, the dried CdS film is compressed from approximately 20 microns to a range generally from 10 to 14 microns, and preferably to approximately 12 microns, by the application of a substantial mechanical force. Both the glass substate and the tin oxide layer can easily withstand the desired compressive force of generally from 5,000 p.s.i. to 10,000 p.s.i., and preferably from 6,000 p.s.i. to 8,000 p.s.i. Although the reason for increased cell regrowth due to this prior compressive action is not fully known, the compressive force substantially reduces the voids between CdS material found when the carrier material evaporates. Also, the contact area between the grains of powder is substantially increased by the compressive action, and the increased contact area of the powder grains resulting from compression may be directly related to the desired increased crystal size during regrowth.

Suitable apparatus for compressing the CdS film layer is shown in FIG. 1. Machine 10 has a standard base 12 and an X-Y table 14. Table 14 may be manually moved in the Y direction by a standard worm screw and handle assembly 16, or may be power driven by drive motor 18 interconnected to the worm screw 16. Movement or indexing of the table in the X-direction is similarly manually controlled by wormscrew and handle assembly 20, which may be powered by drive motor 22.

A panel 24 containing the previously described tin oxide and sprayed cadmium sulfide layers (with the carrier evaporated) may be placed on the table 14, and into engagement with edge strips 26 and 28. If desired, a standard vacuum table containing a plurality of small apertures may be utilized to fixedly position the panel 24 on the table, and vacuum line 30 is accordingly provided. It has been found, however, that a rolling vertically-applied force to the glass substrate produces a minimal force in any direction of the plane of the substrate, and accordingly a vacuum table may not be required.

A vertical plate 54 is rigidly mounted to the machine base 12 via a support 11. A plurality of air/oil cylinders 32, 34, and 36 are each mounted to a plate 54. Each cylinder is activated in the downward direction by air pressure from input line 38, and is provided with a corresponding hydraulic fluid line 40 for returning the cylinders to the upward position once air pressure in lines 38 is relieved. Each cylinder rod 42 thus reciprocates in a vertical path, and preferably all cylinders are simultaneously activated.

Figure 2:
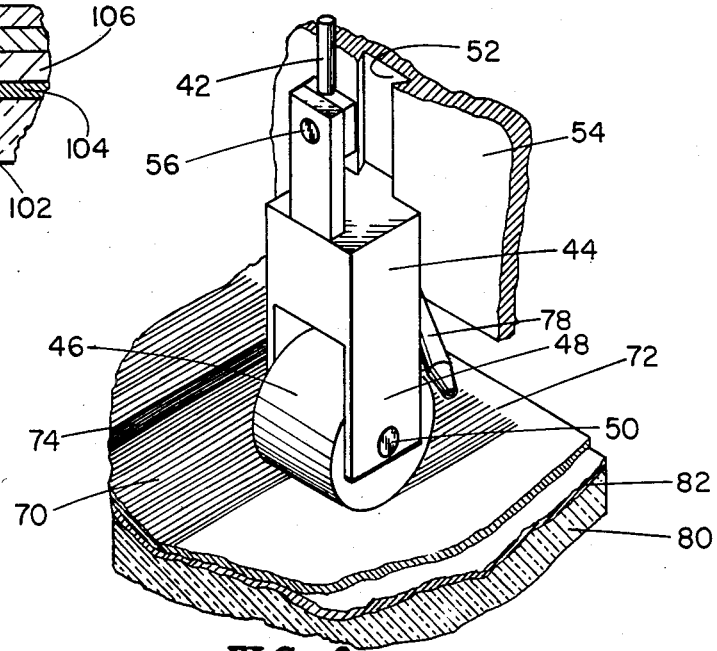
FIG. 2 is a pictorial view of a portion of the apparatus depicted in FIG. 1, with the glass substrate and CdS film shown in cross-section.

Referring now to FIG. 2, block 44 is pivotably connected at 56 to rod 42, and rides within a dovetail channel 52 in the plate 54. Two downwardly extending arms 48 of block 44 are used to rotatably mount roller 46 on pin 50. Dovetail 52 thus restrains movement of block 44 to substantially a vertical direction, although sufficient "play" is provided between block 44 and plate 54 to enable slight pivotable movement of block 44 and thus roller 46 about pin 56. This slight pivotable movement of the roller thus ensures that the roller lays "flat" on the glass substrate during the compression operation.

Referring again to FIG. 1, air pressure at approximately 115 psi is supplied by lines 38 from a suitable source (not shown) to cause rollers 46 to engage and exert a downward force on the CdS film. A typical stainless steel roller has a diameter of approximately 1.5 inches and a width of 0.4 inches, resulting in an instantaneous compressed area of 0.05 inches×0.4 inches for each roller. The downward force exerted by each roller is approximately 170 pounds, so that the compressional force on the CdS film is approximately 8,000 p.s.i.

Once the cylinders have been activated to force the rollers downward into engagement with the substrate, motor 18 may be activated to rotate Y-direction table screw 16 to move table 14 and form a plurality of strips of compressed CdS film. Once stop 58 affixed to table 14 engages limit switch 62 affixed to base 12, rotation of screw 16 is terminated and air pressure to the cylinders is exhausted, allowing hydraulic fluid in lines 40 to raise the cylinders. Once raised, the table may be indexed by activating motor 22 to rotate screw 20 a sufficient number of turns to approximate the width of the compressed strip. The table may then be returned to the position shown in FIG. 1, and when stop 58 engages limit switch 60, the process is repeated. If desired, machine 10 could be easily adapted to compress film while the table travels in both the forward and reverse Y directions.

FIG. 2 thus illustrates a plurality of compressed strips 70 of CdS film overlying the thin tin oxide layer 82 on the glass substrate 80. Preferably a small overlap 74 of compressed strips is utilized, since such an overlap is not deleterious to the subsequent film layer regrowth operation, and ensures that all the film is compressed. FIG. 2 also illustrates that the rolled edge 72 of each strip is spaced slightly, e.g., ¼ inch, from the edge of the glass to ensure that the glass does not crack when the roller is first lowered.

Any minute particles on the CdS film may adversely affect the compression process, and typically result in a thin horizontal strip of film not sufficiently compressed because the roller was raised slightly by the particle. It has been found, however, that sufficient care can be taken to eliminate or substantially reduce the deposition of such particles on the CdS film. Alternatively, the film may be easily cleaned by compressed air to remove such particles from the film prior to compression. A compressed air nozzle 78 is accordingly provided for blowing such particles off the substrate before the table is indexed to that location. A suitable air/hydraulic fluid cylinder is part No. Y5528 (No. 603) manufactured by PHD, Inc., with offices in Fort Wayne, Ind.

After the CdS layer of panel 24 has been compressed, the film is regrown, preferably in a nitrogen rich atmosphere, according to the techniques similar to those described in U.S. Pat. No. 4,362,896, hereby incorporated by reference. In particular, the CdS film is preferably regrown in the heated atmosphere containing cadmium chloride flux vapors. This is accomplished by vertically positioning film layers of adjacent panels in a face-to-face spaced apart relationship within the heated atmosphere to produce the desired crystals. Unlike CdS crystals obtained according to the '896 patent, however, many of the crystals formed according to the present invention have dimensions in excess of 10 microns, and most if not all crystals have dimensions substantially in excess of from 1 to 2 microns. Moreover, the cost of forming the CdS layer has been substantially reduced compared to spray pyrolysis, because no attempt is made to heat the glass to a uniform elevated temperature while spraying the CdS material on the glass. Also, zinc may be added to form an improved voltage $(Zn_xCd_{1-x})S$ film for some photovoltaic device structure.

The CdS film typically may be heated at a temperature of from 480° C. to 580° C, and preferably at approximately 530° C., in a nitrogen atmosphere containing from about 1% to about 3% oxygen. The glass panels are heated for approximately one hour, then cooled down over a period of approximately 45 minutes. The desired cadmium chloride vapors evolve from the film and contribute to the desired crystal growth. After being regrown, the CdS film may be rinsed with methanol and then subsequently rinsed in water to remove excess cadmium chloride on the surface of the CdS film.

Figure 3:
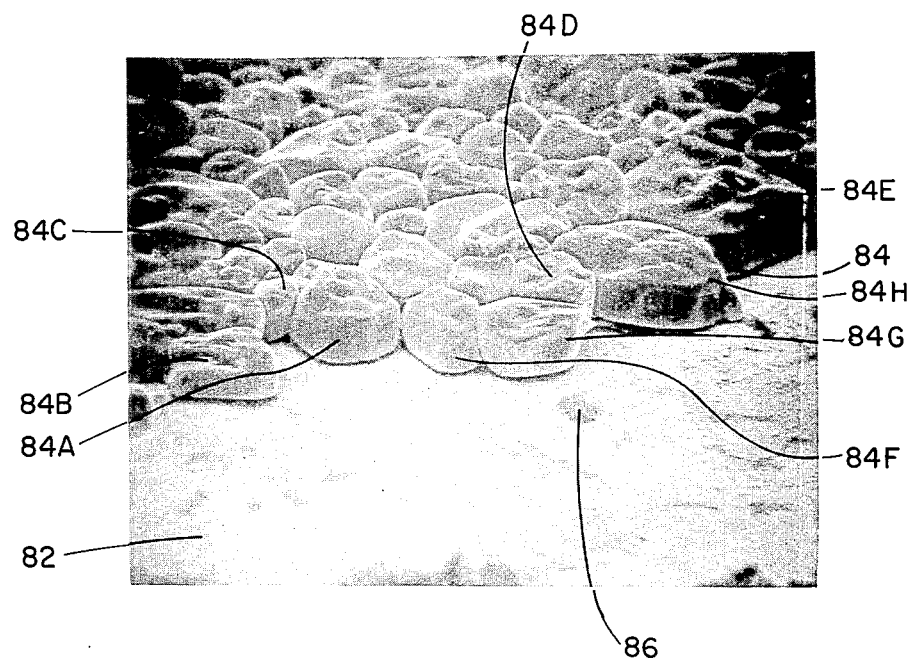
FIG. 3 is a pictorial view of regrown cadmium sulfide crystal layer on a glass substrate manufactured according to the techniques of the present invention.

FIG. 3 depicts an SEM taken at a 70° tilt from perpendicular of a regrown CdS layer 84 formed over a tin oxide layer 82. As previously indicated, a small pin hole in the tin oxide layer, such as pin hole 86, does not dramatically affect the efficiency of the photovoltaic cell, since a uniform conductive layer is nevertheless provided under the CdS layer.

The film layer shown on FIG. 3 is approximately 7 microns thick, and it can be seen that the top surface of the layer and the bottom surface of the layer are each substantially defined by the upper and lower surfaces of crystals. A single layer or monolayer of crystals having a substantially uniform crystal height is thus produced according to the concepts of the present invention. Each of the individual crystals 84A–84G thus has a substantially planar lower surface in engagement with the tin oxide layer, and a substantially planar upper surface. These surfaces, together with similarly situated surfaces of other crystals, thus form the lower and upper surface of the CdS film, respectively.

Crystals 84A, 84B, 84E, 84H, and 84G each have both lengths and widths greater than their 7 micron height, and thus have a mean diameter in excess of 7 microns. Crystals 84D and 84F each have a length and width substantially equal to their 7 micron height, and thus have a mean diameter approximating the thickness of the CdS layer. Finally, crystal 84C appears to have a length and a width somewhat smaller than their height, and thus would have a mean diameter slightly less than the film thickness. As can be seen in FIG. 3, however, a majority of the crystals have a mean diameter in excess of, or at least substantially equal to, the film thickness.

Figure 4:
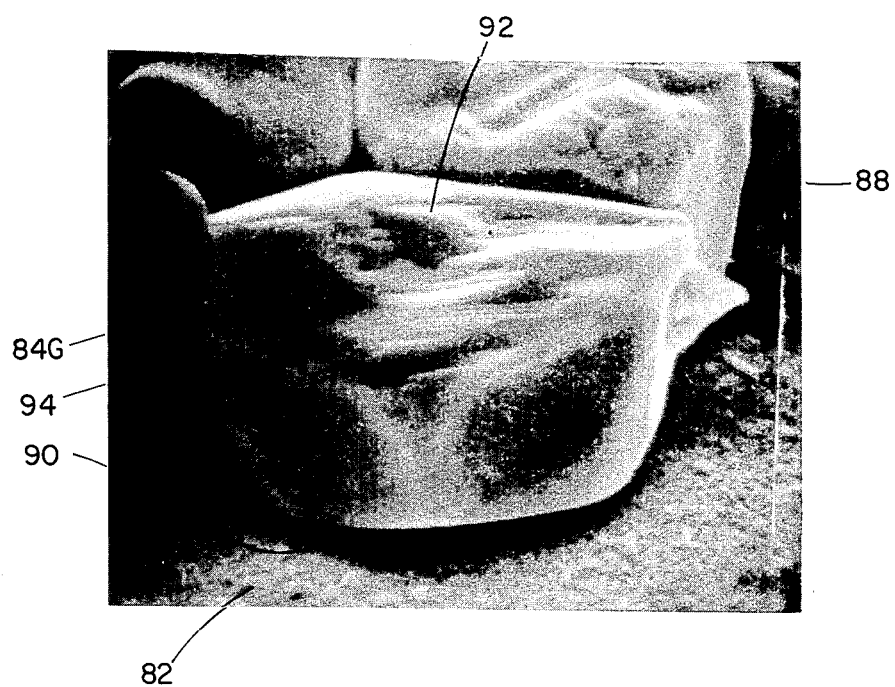
FIG. 4 is a more detailed pictorial view of regrown cadmium sulfide crystals shown in FIG. 3.

FIG. 4 is an SEM at a larger magnification of crystal 84G shown in FIG. 3. Each of the crystals in the CdS layer thus has a substantially planar lower surface 90 in engagement with the tin oxide film layer 82, and a substantially planar upper surface 92. The sides of the crystal comprise a plurality of substantially vertical walls 94 which together define an irregular configuration. FIG. 4 also depicts that, although the upper and lower surfaces of the crystals are somewhat rounded where the surfaces meet the walls, only a very slight gap 88 exists between adjacent crystals. This small or non-existing gap between adjacent crystals eliminates or at least substantially reduces the likelihood of short circuiting between the tin oxide layer and the layer overlying the CdS layer added to form the photovoltaic cell.

The approximately 12 micron thickness compressed CdS film, once regrown, results in the CdS layer having a thickness from 4 to 8 microns, and preferably from 5 to 7 microns. The CdS layer formed according to the present invention is thus much thinner, and therefore less costly, than a film having a thickness of from 20 to 30 microns produced according to silkscreening techniques.

The polycrystalline semi-conductor film formed according to the present invention is particularly suitable for forming a CdS layer for a photovoltaic cell of the backwall configuration. Thus, the above-described layer may be utilized to form a $CdS/Cu_2S$ photovoltaic cell according to the teachings of U.S. Pat. No. 4,362,896. More particularly, a "back-wall" photovoltaic cell may be formed wherein light incident upon a glass substrate passes through the thin, electrically conductive film on the surface of the substrate, and then through the CdS layer to reach a photovoltaic heterojunction. The substrate, the electrically conductive film, and the CdS layer accordingly must each be highly transmissive of light to obtain reasonable efficiency for the back-wall photovoltaic cell. Also, as a particular feature of the present invention to utilize the above described CdS film to form a high efficiency and low manufacturing cost cadmium sulfide/cadmium telluride photovoltaic cell.

Figure 5:
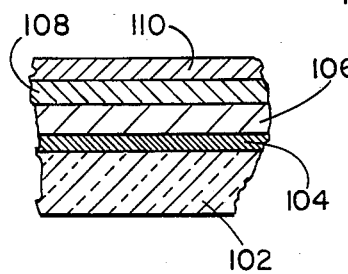
FIG. 5 is a simplified cross-sectional view of a portion of a photovoltaic cell manufactured according to the present invention.

FIG. 5 depicts a simplified cross-sectional view of a photovoltaic cell formed according to the present invention, and including the improved cadmium sulfide layer described above. The back-wall cell is suitable for large scale production of photovoltaic cells on an economic basis, and is formed on a planar glass substrate 102 having any desired thickness, e.g., 0.125". The cell includes a conductive tin oxide layer 104 having a thickness of approximately 0.7 microns or less, a CdS layer 106 of from 4 to 8 microns in thickness, a second polycrystalline layer 108 having a thickness of from 1 to 4 microns and suitable for forming the photovoltaic heterojunction with the CdS layer, and an electrode layer 110 in contact with the second layer and having a thickness of from 0.5 to 2 microns.

According to the present invention, the second polycrystalline layer may be a cuprous sulfide layer formed according to the teachings of the '896 patent. According to a preferred embodiment of the invention, the second layer comprises cadmium telluride. Panels of cadmium sulfide/cadmium telluride photovoltaic cells having dimensions of approximately 12"×12" may thus be formed from glass substrate panels of the same or slightly larger dimensions. The photovoltaic panels may be separated into elongated strips of interconnected photovoltaic cells according to the teachings of U.S. Pat. No. 4,262,411. The panels may then be combined electrically in parallel or in series to form modules, according to the teachings of U.S. Pat. No. 4,223,085.

Although the invention has been described in terms of the specified embodiments which are set forth in detail, it should be understood that this is by illustration only and that the invention is not necessarily limited thereto, since alternative embodiments and operating techniques will become apparent to those skilled in the art in view of the disclosure. Accordingly, modifications are contemplated which can be made without departing from the spirit of the described invention.

What is claimed and desired to be secured by Letters Patent is:

1. A method of forming an improved cadmium sulfide polycrystalline film over an electrically-conductive surface of a glass substrate, comprising:
   mixing a cadmium sulfide powder and a liquid carrier to form a cadmium sulfide-bearing slurry of a desired consistency;
   spraying the slurry while at substantially ambient temperature to form a cadmium sulfide containing layer on the electrically-conductive surface of the glass substrate;
   drying the applied slurry to evaporate at least substantially the entirety of the liquid carrier from the cadmium sulfide containing layer and forming a polycrystalline cadmium sulfide film comprised of relatively small-sized crystals on the glass substrate;
   applying compressive force to the polycrystalline film to substantially reduce the film thickness;
   heating the compressed polycrystalline film and substrate to form a cadmium sulfide polycrystalline film highly transmissive of light incident upon the glass substrate and comprised of relatively larger-sized crystals having a mean diameter equal to or greater than the thickness of the film after heating.

2. The method as defined in claim 1 wherein the slurry is sprayed on the substrate while the substrate is in a substantially horizontal plane.

3. The method as defined in claim 2, further comprising:
   arranging a series of substrate panels on a horizontally moving conveyor belt; and
   the slurry is sprayed from one or more guns positioned above the conveyor belt and moving traversely with respect to the moving substrate panels.

4. The method as defined in claim 1, wherein the applied slurry is dried at a temperature between ambient temperature and the liquid carrier boiling point.

5. The method as defined in claim 1, wherein the step of applying a compressive force to the polycrystalline film comprises:
   applying a compressive force in excess of 5,000 p.s.i. to the film.

6. The method is defined in claim 5, wherein the compressive force is applied to the film by one or more rollers exerting a force perpendicular to the plane of the substrate.

7. The method as defined in claim 5, wherein the application of compressive force reduces the film thickness from approximately 50% to approximately 70% of its precompressed thickness.

8. The method as defined in claim 1, wherein the step of heating the compressed film comprises:

positioning one or more glass substrates in a substantially vertical plane; and thereafter heating the substrate in an atmosphere containing an inert gas and at a temperature in excess of 480° C.

9. The method as defined in claim 8, wherein:

the step of mixing the slurry includes mixing a flux material with the cadmium sulfide powder and the liquid carrier; and the step of positioning the glass substrate in a vertical plane includes positioning the polycrystalline cadmium sulfide film layers in a face-to-face relationship for maintaining a desired concentration of flux vapor.

10. The method as defined in claim 9 wherein the flux material is cadmium chloride.

11. The method as defined in claim 1, wherein the compressed film and substrate are heated to a temperature in the range of from 480° C. to 580° C. to form the relatively larger-sized crystals.

12. The method as defined in claim 11, wherein the compressed film and substrate are heated for a time period such that a majority of the relatively larger-sized crystals have a mean diameter of at least 7 microns.

13. An improved method of forming a large crystal polycrystalline film highly transmissive of light on a rigid substrate, comprising:

mixing a selected powder suitable for forming the polycrystalline layer and a liquid carrier to form a slurry of a desired consistency;

applying the slurry while at substantially ambient temperature to form a polycrystalline layer on the substrate;

drying the applied slurry to evaporate at least substantially the entirety of the liquid carrier and forming a polycrystalline film on the substrate having relatively small diameter crystals;

applying a compressive force to the polycrystalline film to reduce the film thickness to a thickness less than approximately 70% of its precompressed thickness; and heating the compressed film and substrate to a temperature sufficient to form a semiconductor film comprised of crystals having a mean diameter substantially greater than the diameter of the crystals prior to heating, such that the mean diameter of at least some of the crystals after heating is equal to or greater than the thickness of the film after heating.

14. The method as defined in claim 13, wherein the application of compressive force reduces the film thickness from approximately 50% to approximately 70% of its precompressed thickness.

15. The method as defined in claim 13, wherein the step of applying the slurry comprises:

arranging a series of substrate panels on a horizontally moving conveyor belt; and spraying the slurry on the substrate panels, while the panels are in a substantially horizontal position.

16. The method of forming an improved light-transmissive polycrystalline cadmium sulfide layer for a back-wall photovoltaic cell having a light-transmissive substrate, an electrically conductive light-transmissive film overlying a surface of the substrate, the cadmium sulfide layer overlying the electrically conductive film, and another polycrystalline layer overlying the cadmium sulfide layer and forming a photovoltaic heterojunction therewith, comprising:

mixing a cadmium sulfide power and a liquid carrier to form a cadmium sulfide-bearing slurry of a desired consistency;

applying the slurry while at a substantially ambient temperature to form a cadmium sulfide containing layer on the electrically conductive light-transmissive film overlying the surface of the glass substrate;

drying the applied slurry to evaporate at least substantially the entirety of the liquid carrier from the cadmium sulfide containing layer and forming a polycrystalline cadmium sulfide layer comprised of relatively small-sized crystals on the glass substrate;

applying a compressive force to the polycrystalline layer to reduce the layer thickness to a thickness less than approximately 70% of its precompressed thickness; and heating the compressed polycrystalline layer and substrate to a temperature sufficient to form a cadmium sulfide polycrystalline layer highly transmissive of light incident upon the substrate and comprised of relatively larger-sized, crystals such that the mean diameter of at least some of the crystals after heating is equal to or greater than the thickness of the film after heating.

17. The method as defined in claim 16, wherein the slurry is applied by spraying the slurry on the substrate while the substrate is in a substantially horizontal plane.

18. The method as defined in claim 17, further comprising:

arranging a series of substrate panels on a horizontally moving conveyor belt; and the slurry is sprayed from one or more guns positioned above the conveyor belt and moving traversely with respect to the moving substrate panels.

19. The method as defined in claim 16, wherein:

the step of mixing the slurry includes mixing a flux material the cadmium sulfide powder and the liquid carrier; and the step of heating the compressed film and substrate includes positioning a plurality of glass substrates in a substantially vertically plane with the polycrystalline cadmium sulfide layers in face-to-face relationship for maintaining a desired concentration of flux vapor.

20. The method as defined in claim 16, wherein the compressed film and substrate are heated to a temperature in the range of from 480° C. to 580° C. to form the relatively larger-sized crystals.

* * * * *

UNITED STATES PATENT AND TRADEMARK OFFICE
CERTIFICATE OF CORRECTION

PATENT NO. : 4,735,909
DATED : April 5, 1988
INVENTOR(S) : Scot P. Albright et al It is certified that error appears in the above-identified patent and that said Letters Patent is hereby corrected as shown below:

In column 8, line 59, delete "is" and insert therefor --as--.

In column 10, line 8, delete "power" and insert therefor --powder--.

In column 10, line 30, after "larger-sized" delete ",".

In column 10, line 48, after "material" insert --with--.

In column 10, line 52, delete "vertically" and insert therefor --vertical--.

Signed and Sealed this

Twentieth Day of June, 1989

Attest:

DONALD J. QUIGG

*Attesting Officer*     Commissioner of Patents and Trademarks